(12) United States Patent
Taylor et al.

(10) Patent No.: US 10,700,255 B1
(45) Date of Patent: Jun. 30, 2020

(54) HIGH-TEMPERATURE SUPERCONDUCTOR TERAHERZ EMITTING DIODE

(71) Applicant: THE UNITED STATES OF AMERICA AS REPRESENTED BY THE SECRETARY OF THE NAVY, San Diego, CA (US)

(72) Inventors: Benjamin J. Taylor, Escondido, CA (US); Teresa H. Emery, San Diego, CA (US); Susan Berggren, San Diego, CA (US); Anna M. Leese De Escobar, Encinitas, CA (US)

(*) Notice: Subject to any disclaimer, the term of this patent is extended or adjusted under 35 U.S.C. 154(b) by 0 days.

(21) Appl. No.: 15/906,302

(22) Filed: Feb. 27, 2018

Related U.S. Application Data

(63) Continuation-in-part of application No. 15/200,674, filed on Jul. 1, 2016, now Pat. No. 10,283,695.

(51) Int. Cl.
*H01L 39/22* (2006.01)
*H01L 39/12* (2006.01)

(52) U.S. Cl.
CPC .......... *H01L 39/225* (2013.01); *H01L 39/125* (2013.01)

(58) Field of Classification Search
CPC ........................... H01L 39/225; H01L 39/125
See application file for complete search history.

(56) References Cited

U.S. PATENT DOCUMENTS 5,845,220 A * 12/1998 Puthoff .................... H01Q 7/00
455/899
8,633,472 B2    1/2014 Boulaevskii et al.
9,188,514 B1   11/2015 Taylor
9,450,165 B1    9/2016 Taylor
2017/0133577 A1 * 5/2017 Cybart .................... H01L 27/18

OTHER PUBLICATIONS

Taylor, B. J. et al., "Correlation of structural, magnetic, and electronic transitions of a novel charge-gradient YBa2Cu3Ox film", Phys. Rev. B 91, 144511 (2015).
Taylor, B. J. et al., "Preparation of novel HTS films and tunnel junctions for advanced C3I sensor applications", Proc. SPIE 9467, 946725 (2015).

(Continued)

*Primary Examiner* — Paul A Wartalowicz
(74) *Attorney, Agent, or Firm* — Kyle Eppele; Ryan J. Friedl; Susanna J. Torke (57) ABSTRACT

A system includes a substrate having a high-temperature superconductor compound film disposed thereon. A first superconducting region is formed within the film and has a first stabilized oxygen content. A second superconducting region is also formed within the film and is located adjacent to the first superconducting region. The second superconducting region has a second stabilized oxygen content. A boundary region is formed within the film and separates the first superconducting region from the second superconducting region. A voltage source is connected to the first superconducting region and the second superconducting region. The boundary region emits electromagnetic radiation responsive to an applied voltage from the voltage source to one of the first superconducting region and the second superconducting region. A current flows from the first superconducting region to the second superconducting region, or vice versa, responsive to the applied voltage.

20 Claims, 4 Drawing Sheets

(56) References Cited

OTHER PUBLICATIONS

Y.Asano, Y. et al., "Luminescence of a Cooper Pair", Phys. Rev. Lett. 103, 187001 (2009).
Recher, P. et al, "The Josephson light-emitting diode", Phys. Rev. Lett. 104, 156802 (2010).
Godschalk, F, et al., "Proposal for an optical laser producing light at half the Josephson frequency", Phys. Rev. Lett. 107, 073901 (2011).
Godschalk, F. et al, "Optical stabilization of voltage fluctuations in half-Josephson lasers", Phys. Rev. B 87, 094511 (2013).
S. A. Cybart, et. al., "Nano Josephson superconducting tunnel junctions in YBa2Cu3O7 directly patterned with a focused helium ion beam", Nature Nanotechnology 10, 598 (2015).
Martinez-Perez, M. J. et. al., "Efficient phase-tunable Josephson thermal rectifier", Appl. Phys. Lett. 102, 092602 (2013).
Mou, S.S. et al., "Superconducting Light-Emitting Diodes", IEEE Journal of Selected Topics in Quantum Electronics, vol. 21, No. 2, Mar./Apr. 2015.
Mitchell, E.E., et al., "2D SQIF arrays using 20000 YBCO high Rn Josephson junctions", Supercond. Sci. Technol. 29, IOP Publishing, pp. 1-8, (2016).
Taylor et al., "Evaluation of Characteristic Energy Scales of Pressure Stabilized Oxygen Chain States in YBa2Cu3Ox Films", Technical Report 3060, SPAWAR Systems Center Pacific, Mar. 2017 (see Report Documentation page for date—mistakenly references Mar. 2016 on front page).

\* cited by examiner

HIGH-TEMPERATURE SUPERCONDUCTOR TERAHERZ EMITTING DIODE

CROSS-REFERENCE TO RELATED APPLICATIONS

This application is a continuation-in-part of U.S. patent application Ser. No. 15/200,674 filed Jul. 1, 2016, entitled "Method for Creating High-Resolution Micro-To Nano-Scale Structures in High-Temperature Superconductor Films", the content which is fully incorporated by reference herein.

FEDERALLY SPONSORED RESEARCH AND DEVELOPMENT

This invention is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 103992.

BACKGROUND

A direct link from cryogenic circuitry and devices to ambient temperature technologies is important for the widespread adoption of superconducting technology into various sensing and wide-band communication applications. Cryogenic circuits and/or sensors must communicate with networks operating at room temperature. This suggests the use of electro-optical circuits and/or optical fiber technology for the egress of large bandwidth high-speed data/signals. There is a need for a system that, among other useful benefits, can provide a direct data link between cryogenic platforms and room temperature electronics.

DETAILED DESCRIPTION OF SOME EMBODIMENTS

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

As used herein, the terms "about" and "approximately" generally mean plus or minus 2% of the value stated. For example, about or approximately 6.81 would include 6.6738 to 6.9462 and about or approximately 7 would include 6.86 to 7, where 7 is the maximum value.

The disclosed embodiments involve a superconducting device that emits light by superconducting electron-quasi-particle recombination. A p-n like boundary region is formed along the length of a specially prepared a bi-crystalline film. The embodiments of the devices described herein involve a one-layer device using only one material, disposed on a substrate. Superconducting leads and/or circuitry can be placed on each side of the boundary to modulate the voltage across the junction.

The disclosed embodiments involve devices having intrinsic superconducting p-n like junctions. The physical boundary between structural quantum super-lattice states is used to create a p-n like junction that can be incorporated into superconducting circuitry in various functional configurations. Using a method described in part in U.S. Pat. No. 9,188,514 to Taylor, a film of the high-Temperature superconducting compound $YBa_2Cu_3O_x$ [$6 \leq x \leq 7$] (and analogous materials) is prepared so that two adjacent regions are created having different stabilized oxygen content x. As an example, one superconducting region has an oxygen content of about x=7 and another region has an oxygen content of about x~6.81, corresponding to the quantum super-lattice states referred to as <1> and <$1^4$0>, respectively.

The p-n like junction configuration could also potentially be used in a heat flow interferometer configuration, where heat currents flowing through the circuit are seen to interfere. Thermal transport has been demonstrated to coherently modulate through the application of a magnetic flux. One potential application of the devices in accordance with the disclosed embodiments is for thermal management of superconducting circuitry.

Figure 1A:
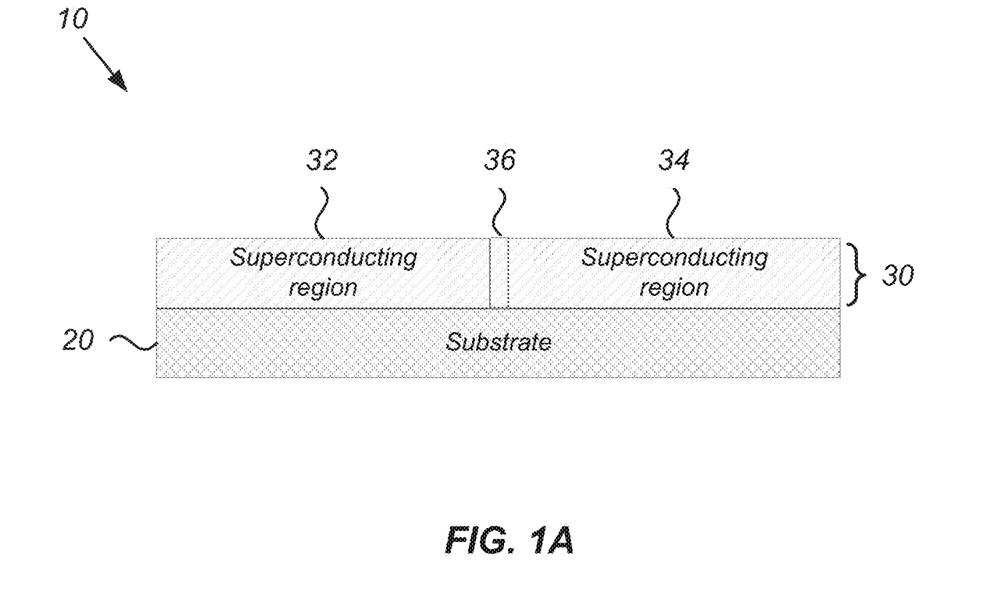
FIG. 1A shows a side cross-section view of an embodiment of a device in accordance with the disclosed embodiments.
Figure 1B:
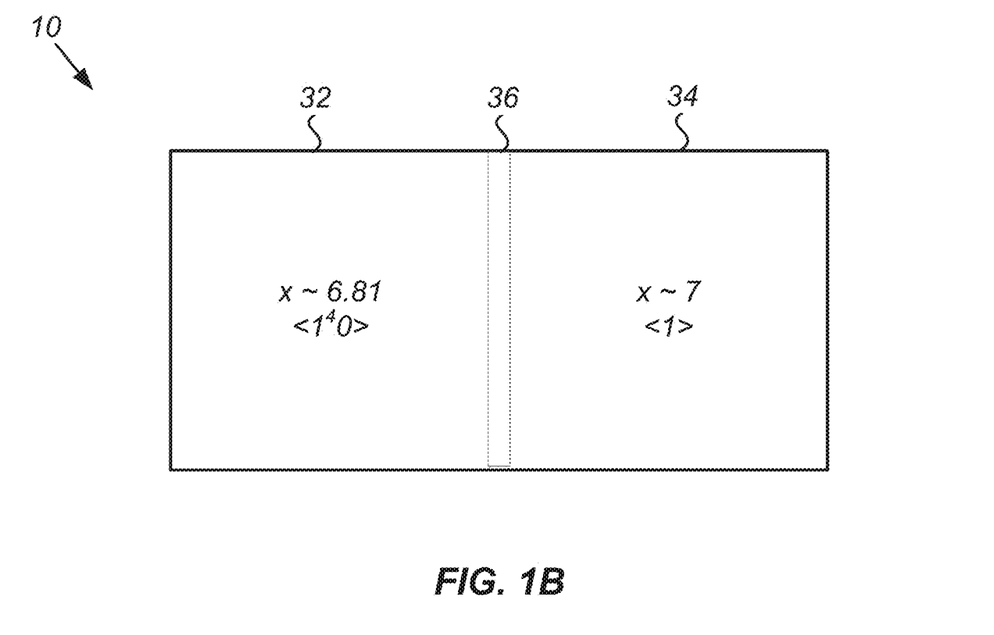
FIG. 1B shows a top view of the device shown in FIG. 1A, noting the oxygen content levels and corresponding lattice configurations of the superconducting regions.

Referring to FIGS. 1A and 1B, FIG. 1A shows a side cross-section view of an embodiment of a device 10 and FIG. 1B shows a top view of device 10. Device 10 includes a substrate 20 having a film 30 disposed thereon. Commercially available substrates of thickness between about 0.5 mm and about 1 mm are typically used; however, the substrates may be considerably thinner or thicker. In some embodiments, substrate 20 comprises one of aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$) (YSZ). However, it should be recognized that substrate 20 may comprise other chemically-similar materials as would be recognized by a person having ordinary skill in the art.

In some embodiments, film 30 comprises a high-temperature superconductor compound belonging to the class of compounds having a compositional form of $R_{1-y}M_yBa_2Cu_{3-z}T_zO_x$, where x is oxygen content and $6 \leq x \leq 7$, wherein $0 \leq y \leq 1$, where $0 \leq z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn).

As an example, film 30 is comprised of the low-anisotropic high-$T_c$ compound $YBa_2Cu_3O_7$. This compound has anisotropic thermal conductivity—near x=7, heat flows about 10 times greater in the in-plane (a-b) direction than in the out of plane (c) direction. Further, the anisotropy of the heat flow increases as x decreases—heat flow becomes even more channeled along the direction of the film/substrate interface as the oxygen content is reduced during the annealing process. This results in non-negligible reflection of heat flow at the film/substrate boundary. The anisotropic thermal properties of $YBa_2Cu_3O_x$ are highly relevant to the thermal gradient annealing process, as it impacts the manner in which heat flows through the sample and across the film/substrate interface.

In some embodiments, film 30 is an untwined film as is disclosed in U.S. Pat. Nos. 9,188,514 and 9,450,165 both to Taylor et al., the entire content of which is incorporated by reference herein. As an example, an untwined film 30 of $YBa_2Cu_3O_x$ may be photo-lithographically patterned such that the nanowire long dimension runs parallel to the crystallographic b-axis of film 30. Because of the applied pressure used to prepare the films (so that they have the desired regions of oxygen content) the films will be detwinned and the length of the boundary will be aligned with the b-axis. Any circuit path crossing the superconducting THz diode boundary will be oriented along the a-axis. Further, as an example, the thickness of film 30 ranges from about 10 nm to about 100 nm, but can be thicker to the extent that film quality can be maintained, potentially up to about 1000 nm with the appropriate film processing procedures.

Film 30 has superconducting regions 32 and 34 formed therein. Superconducting regions 32 and 34 comprise particular regions of film 30 that have a stabilized oxygen content x that is within the range of $6 \leq x \leq 7$. For example, superconducting region 32 has an oxygen content level of about x=6.81, corresponding to a structural super-lattice state of $<1^4 0>$, and superconducting region 34 has an oxygen content level of about x=7, corresponding to a structural super-lattice state of $<1>$. However, in some embodiments, superconducting regions 32 and 34 may have different oxygen content levels corresponding to different structural super-lattice states, which produce photonic emission having a different frequency level. For example, in one embodiment superconducting region 32 may have an oxygen content level of about x=6.50, corresponding to a structural super-lattice state of $<10>$, and superconducting region 34 may have an oxygen content level of about x=6.72, corresponding to a structural super-lattice state of $<1^3 0110>$. In another embodiment, superconducting region 32 may have an oxygen content level of about x=6.72, corresponding to a structural super-lattice state of $<1^3 0110>$, and superconducting region 34 may have an oxygen content level of about x=6.81, corresponding to a structural super-lattice state of $<1^4 0>$.

To prepare film 30 such that it has superconducting regions 32 and 34 with the respective aforementioned oxygen content levels, the embodiments of the methods and systems disclosed in U.S. Pat. Nos. 9,188,514 and 9,450,165 both to Taylor et al., the entire content of each being incorporated by reference herein, may be used.

Figure 4:
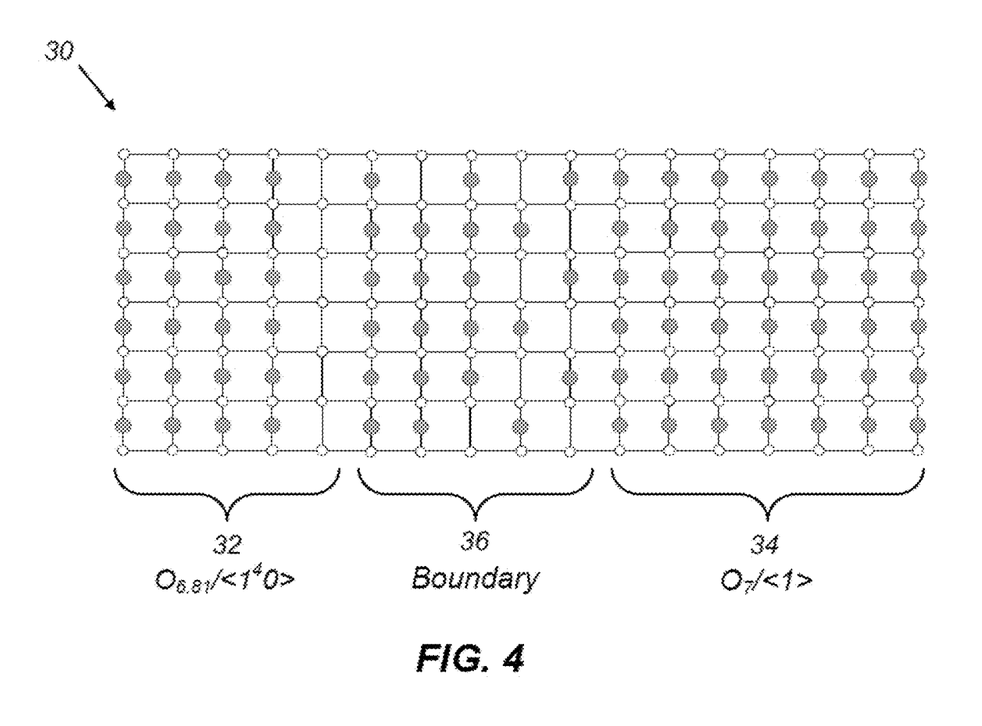
FIG. 4 shows a diagram illustrating the lattice configuration for an embodiment of a film having superconducting regions and a boundary layer therein in accordance with the disclosed embodiments.

A boundary region 36 is between superconducting regions 32 and 34. Boundary region 36 is a structural transition (i.e. physical boundary) between structural quantum super-lattice states, such as states $<1^4 0>$ and $<1>$ which correspond to respective oxygen content x levels of about 6.80 and about 7. FIG. 4 shows an example of a lattice configuration of film 30 including superconducting regions 32 and 34 having states $<1^4 0>$ and $<1>$, respectively, with boundary region 36 in between. It should be noted that in different embodiments boundary region 36 may have a different atomic configuration and arrangement than as is specifically shown and may have a different width. Boundary region 36 is used to create a p-n junction which can be incorporated into superconducting circuitry in various functional configurations. Boundary region 36 between the two superconducting regions 32 and 34 of film 30 ([p=0.15, $<1^4 0>$] and [p=2.0, $<1>$], respectively) may range in width of approximately 1 µm to as small as 1 nm.

The application of increasing uniaxial mechanical pressure may result in a corresponding decrease in the size of the boundary region as the pressure stabilizes each region of film 30. This width would produce a local electric field within the lattice ranging from about 10 kV/m to about 10 MV/m, respectively. Equivalently, this would represent an approximately 10 meV (one way) barrier. Current would flow unimpeded from the [p=2.0, $<1>$] side, but would require about 10 meV to flow in the opposite direction. As used herein, p refers to the hole (carrier) doping content in the copper-oxygen plane (i.e. the number of doped holed per copper atom in the $CuO_2$ plane with respect to the parent compound YBCO), or otherwise the oxygen content.

Figure 2A:
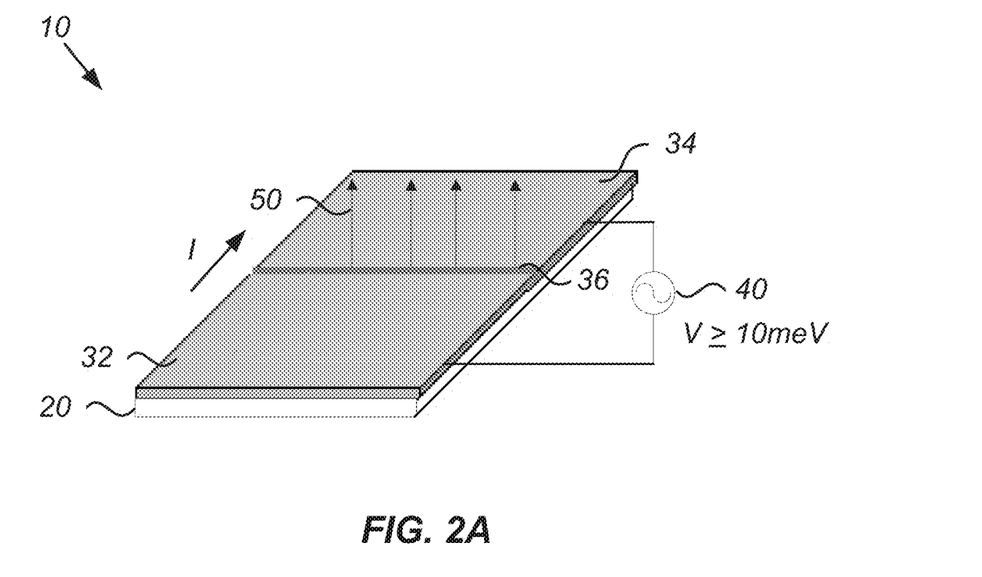
FIG. 2A shows a front perspective view illustrating an embodiment of a device connected to a voltage source with current flowing from the first superconducting region to the second superconducting region.
Figure 2B:
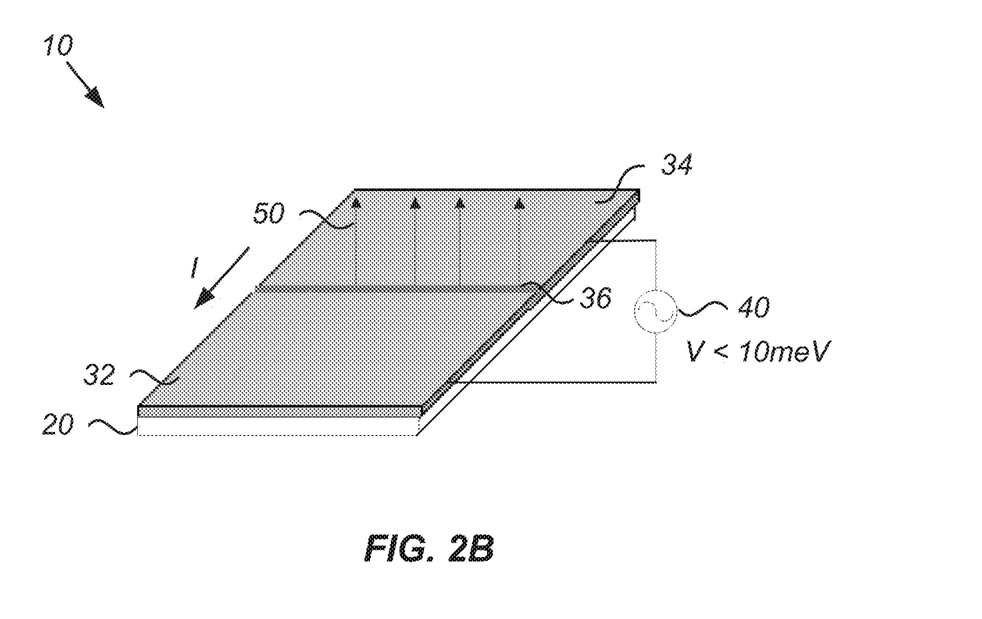
FIG. 2B shows a front perspective view illustrating an embodiment of a device connected to a voltage source with current flowing from the second superconducting region to the first superconducting region.

FIGS. 2A and 2B show diagrams 100 illustrating a front perspective view device 10 shown in FIGS. 1A and 1B connected to a voltage source 40. Voltage source 40 may be either a DC or AC source. As shown in FIG. 2A, voltage source 40 provides a voltage of V=≥10 meV, which produces a current I flowing from first superconducting region 32 to second superconducting region 34. As shown in FIG. 2B, voltage source 40 provides a voltage of V=<10 meV, which produces a current I flowing from second superconducting region 34 to first superconducting region 32. When current I flows across the p-n like boundary region 36, in either direction, photon emission 50 occurs.

The number of photons emitted (intensity) is proportional to the current through the junction. By a reduction of the dimensions of the boundary region via film thickness and/or nanowire dimension crossing the boundary region, it is possible to reduce the number of photons emitted. For example, given films having a thickness ~30 nm, a lateral dimension (width of nano-wire path) of ~50 nm and boundary region width of ~10 nm, the number of photons continuously emitted may be reduced to ~<10. Because the superconducting gap energy is temperature dependent, the temperature at which the diode is operated will determine the actual frequency of emission. The temperature dependence of the gap energy is approximately given by $$\Delta(T) = \Delta_0 \tanh\left(\frac{\Delta_0}{3.2 \text{ meV}} \sqrt{\frac{T_c}{T} - 1}\right),$$

with $\Delta_0 \approx 5.0 \, k_B T_c$. Subsequently, the frequency of emission will be reduced by a factor corresponding to the reduction of $\Delta(T)$ at temperatures $0 < T < T_c$.

It may also be possible to tune the THz frequency by doping the copper site in the film with cobalt (Co), iron (Fe), nickel (Ni), and/or zinc (Zn). If the lattice superstructures can still be formed from a doped film, then, the effect of the doping substitution will be to reduce the gap energies (in both/all regions) in a continuous manner so that the frequency of emission can be arbitrarily lowered a desired set point. It should be noted however, that the reduction of the gap energy will necessarily result in a reduction of the critical temperature, $T_c$, and hence will lower the temperature at which the device must operate. For example, the device may be incorporated into a low-$T_c$ electronics package operating at ~4K. The critical temperature of the YBCO film/diode can be reduced by a factor of ~10 (from 93 K to 9.3 K) and remain operational—with a corresponding reduction of the frequencies of emission to ~0.255 THz and 0.469 THz. In some embodiments, superconducting circuitry (not shown) is placed on either side or both sides of boundary region 36 to modulate the voltage across boundary region 36.

Figure 3:
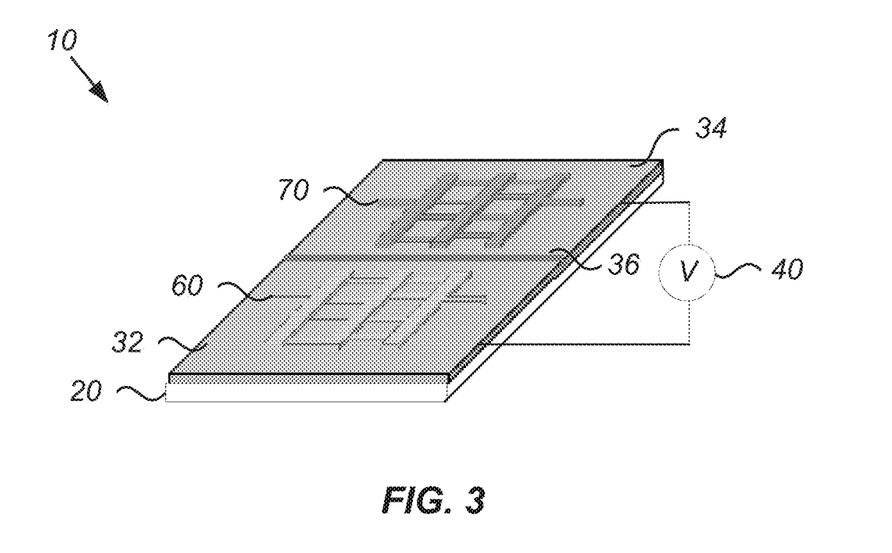
FIG. 3 shows a front perspective view illustrating an embodiment of a device having two SQUIDS thereon in accordance with the disclosed embodiments.

FIG. 3 shows a front perspective view illustrating device 10 having two superconducting quantum interference device (SQUID) arrays disposed thereon. As shown, a first SQUID array 60 is disposed on first superconducting region 32 and a second SQUID array 70 disposed on second superconducting region 34. The voltage outputs of the first SQUID array 60 and second SQUID array 70 may be arranged such that they connect across the boundary region so that the voltage difference modulates the output of the p-n like diode THz emission. This would be accomplished by having opposing magnetic bias fields on each SQUID array through the use of two underlying bias loops/solenoids/coils. In some embodiments, first SQUID array 60 and second SQUID array 70 are configured the same, whereas in other embodiments they are differently configured to make different use of the diode asymmetry. As an example, SQUID arrays 60 and 70 may be configured the same or similar as those found in Mitchell, E. E., et al., "2D SQIF arrays using 20000 YBCO high Rn Josephson junctions", Supercond. Sci. Technol. 29, 084003 (2016); or S. A. Cybart, et. al., "Nano Josephson superconducting tunnel junctions in YBa2Cu3O7-δ directly patterned with a focused helium ion beam", Nature Nanotechnology 10, 598 (2015). It should be noted however that any SQUID array that can be made from YBCO on the same film would be suitable for the embodiments of the devices disclosed herein.

Further, in some embodiments first SQUID array 60 and second SQUID array 70 are coupled to boundary region 36. The SQUID arrays (SQA) are "coupled" to the boundary region in the sense that there exists a circuit path wherein the voltages generated by each array are connected to either oppose or assist each other, i.e., V(+)[SQA$_1$]→diode →V(+)[SQA$_2$], where the modulating voltage $\Delta V=V(+)[SQA_1]-V(+)[SQA_2]$; or V(+)[SQA$_1$]→diode →V(-)[SQA$_2$], where the modulating voltage $\Delta V=V(+)[SQA_1]-V(-)[SQA_2]$, where SQA$_1$ is a first SQUID array and SQA$_2$ is a second SQUID array.

Additionally, it should be noted that while the SQUID arrays are incorporated into some embodiments, any circuit operating at the same cryogenic temperatures as the diode device could potentially make use of the link provided by the diode for purposes such as communication between electrical and cryogenic components. A more complex device could include SQUID arrays as part of the link, i.e., the SQUID arrays could "read" and subsequently amplify the signal from another circuit, and then pass that across the diode to complete the link.

The disclosed embodiments allow for a new type of superconducting diode. If the boundary region is large (>about 50 nm) then it will behave much like a Zener diode where it allows supercurrent to flow not only from its (effective) anode to its (effective) cathode, but also in the reverse direction, when the threshold voltage of about 10 meV is reached. When the threshold voltage is reached the device is expected to produce approximately 1-6 THz emissions in a manner similar to a photo-diode, via a recombination of superconducting pairs with normal state quasiparticles. This is anticipated due to the discussion below.

YBCO is one of many high-$T_c$ cuprate superconducting compounds. In these materials, only a portion of the conduction electrons enter the superconducting state (through the formation of Cooper pairs, i.e., electrons paired together via an effective interaction) below the critical temperature, $T_c$. This is in contrast to conventional superconductors where all the conduction electrons Bose-condense into the ground state. Graph 100 shown in FIG. 5 illustrates the ratios of normal state, $n_n$, to superconducting state, $n_s$, electron density, $n_n/n_s$, for the [p=0.15, <1$^4$0>] and [p=2.0, <1>] regions of ≈1.6 and 4, respectively.

Figure 5:
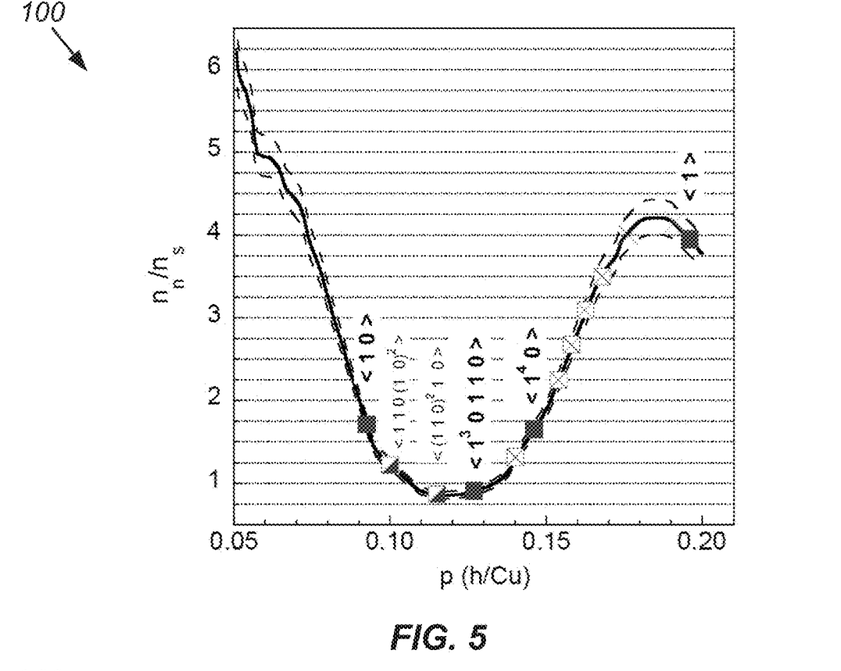
FIG. 5 shows a graph illustrating the calculated ratio of the normal state carrier density to the superconducting state carrier density for a $YBa_2Cu_3O_x$ system.

Referring to FIG. 5, the dashed lines are calculated by assuming a ±0.2 $m_e$ deviation of m*, where $m_e$ is the free electron mass and m* is the effective electron mass. The corresponding locations of the superstructure lattice states are indicated. Filled squares correspond to pressure stabilized fourth level branch states, open squares with filled triangles indicate metastable fourth level states, open squares with x indicate possible locations of lower level branches, and x indicates the absence of any predicted state. Given that the ratio of the values of the carrier concentration is:

$$p(<1^4 0>)/p(<1>)=0.15/0.2=\tfrac{3}{4}=(n_n+n_s)^{<1^4 0>}/(n_n+n_s)^{<1>}, \quad \text{(Eq. 1)}$$

we can solve this to find that:

$$(n_n)^{<1^4 0>} = \frac{1}{2}(n_n)^{<1>}, \quad \text{(Eq. 2)}$$

and $$(n_s)^{\langle 1^4 0 \rangle} = \frac{5}{4}(n_s)^{\langle 1 \rangle}. \quad \text{(Eq. 3)}$$

Thus, for supercurrent to flow from $\langle 1^4 0 \rangle$ to $\langle 1 \rangle$, a portion of the $\langle 1^4 0 \rangle$ Cooper pairs must decay to become normal state electrons. This process is anticipated to result in photon emission. From the analysis below, there would be an energy level of $$E = (0.65) \times 30 \text{ meV} = 19.4 \text{ meV} \rightarrow v = \frac{E}{h} \approx 4.69 \text{ THz}.$$

It should be noted that these frequencies correspond to the maximum possible and that use at an elevated temperature reduces the frequency as noted above.

Figure 6:
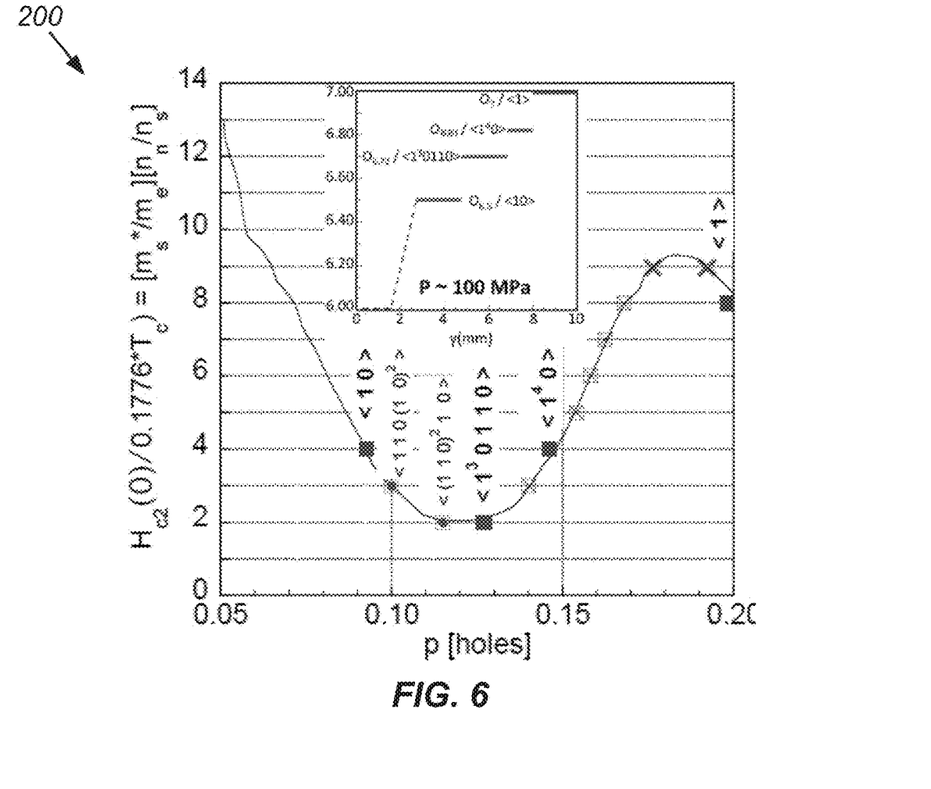
FIG. 6 shows a graph illustrating the ratio of the upper critical field value to the superconducting critical temperature as a function of hole doping in the compound $YBa_2Cu_3O_x$.

Concurrently, there are also two different superconducting order parameters on each side of the barrier. Using Eq. 4, $$(\Delta_0)_{i+1} \approx 2\left(\frac{\eta_i}{\eta_i + 1}\right)\left(\frac{[k.e.]_{i+1}}{[k.e.]_i}\right)(\Delta_0)_i, \quad \text{(Eq. 4)}$$

where $i \in [1,2,3] = [\langle 1^3 0110 \rangle, (\langle 10 \rangle; \langle 1^4 0 \rangle), \langle 1 \rangle]$, and graph 200 illustrated in FIG. 6, it is shown that there is a relationship between the two associated gap energy values involving relative kinetic energies and ratios of $n_n/n_s$. As shown in FIG. 6, the corresponding locations of the superstructure lattice states are indicated: filled squares correspond to pressure stabilized states, open squares with filled circles indicate metastable states, open squares with an x indicates possible locations of lower level branches, and an x indicates the absence of any predicted state. The inset depicts the spatial distribution of the stabilized lattice structures on a $YBa_2Cu_3O_{\nabla x}$ film subjected to uniaxial pressure, P~100 MPa, during annealing.

Because the critical temperatures of the two crystal structures, $\langle 1^4 0 \rangle$ and $\langle 1 \rangle$ are nearly equal, the kinetic energy $$\left(K.E. \equiv \frac{1}{2}m_s^* v_F^2\right)$$

increases nearly linearly as a function of hole doping in the cuprates. Using an energy gap of 30 meV for optimal doping, $(K.E.)^{\langle 1 \rangle} \approx 1.05(K.E.)^{\langle 1^4 0 \rangle}$. Using the following Eq. 5, $$T_c = \frac{\pi^3}{3k_B}\left(\frac{n_s}{n_n}\right)\frac{\Delta_0^2}{0.5 m_s^* v_{F_s}^2}, \quad \text{(Eq. 5)}$$

where $0.5 m_s^* v_{F_s}^2$ is the kinetic energy of the superconducting electrons, where $v_F$ is the Fermi velocity and $m_s^*$ is the effective mass of the superconducting electrons, we arrive at $\Delta_0^{\langle 1^4 0 \rangle} \approx 0.65 \Delta_0^{\langle 1 \rangle}$, so that there is a reduction in pairing energy of 19.4 meV for Cooper pairs crossing boundary region 36 from $\langle 1 \rangle$ to $\langle 1^4 0 \rangle$. In this case, there would be photon emission associated with reduction of pairing energy such that $$E = (1 - 0.65) \times 30 \text{ meV} = 10.56 \text{ meV} \rightarrow v = \frac{E}{h} \approx 2.55 \text{ THz}.$$

Accordingly, the embodiments of the devices disclosed herein may operate as a single frequency (e.g. about 2.55 THz or about 4.69 THz) DC driven THz emitter or a dual frequency AC driven emitter. It may also be possible to tune the THz frequency by doping the copper site in the film with cobalt (Co), iron (Fe), nickel (Ni), and/or zinc (Zn), as discussed above. The embodiments disclosed herein could also potentially be used in many applications analogous to applications for which common diodes are used. As an example, the embodiments of the devices disclosed herein may be used to extract modulation from radio signals in radio receivers, as a temperature sensor, or as a voltage reference.

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

We claim:

1. A system comprising:
 a substrate;
 a film disposed on the substrate, the film comprising a high-temperature superconductor compound belonging to the class of compounds having a compositional form of R1-yMyBa2Cu3-zTzOx, where x is oxygen content and 6≤x≤7, wherein 0≤y≤1, where 0≤z≤1, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn);
 a first superconducting region formed within the film, the first superconducting region having a first stabilized oxygen content;
 a second superconducting region formed within the film and located adjacent to the first superconducting region, the second superconducting region having a second stabilized oxygen content;
 a boundary region formed within the film and separating the first superconducting region from the second superconducting region, the boundary region having a width between about 1 μm and about 1 nm; and
 a voltage source connected to the first superconducting region and the second superconducting region, wherein the boundary region emits electromagnetic radiation responsive to an applied voltage from the voltage source to one of the first superconducting region and the second superconducting region.

2. The system of claim 1, wherein the substrate comprises one of: aluminum oxide ($Al_2O_3$), magnesium oxide (MgO), magnesium aluminate (MgAl2O4), zinc oxide (ZnO), strontium titanate (SrTiO3), lanthanum aluminate (LaAlO3), lithium niobate (LiNbO3), neodynium gallate (NdGaO3), strontium lanthanum aluminate (SrLaAlO3), strontium lanthanum gallate (SrLaGaO3), ytterbium aluminate (YtAlO3), and yttria-(Y2O3)-stabilized zirconia (ZrO2) (YSZ).

3. The system of claim 1, wherein the first stabilized oxygen content is 6.5 and the second stabilized oxygen content is 6.72.

4. The system of claim 1, wherein the first stabilized oxygen content is 6.72 and the second stabilized oxygen content is 6.81.

5. The system of claim 1, wherein the first stabilized oxygen content is 6.81 and the second stabilized oxygen content is 7.

6. The system of claim 1, wherein the applied voltage from the voltage source is less than about 10 meV.

7. The system of claim 6, wherein a current flows from the second superconducting region to the first superconducting region responsive to the applied voltage.

8. The system of claim 1, wherein the applied voltage from the voltage source is greater than or equal to about 10 meV.

9. The system of claim 8, wherein a current flows from the first superconducting region to the second superconducting region responsive to the applied voltage.

10. The system of claim 1 further comprising a first superconducting quantum interference device (SQUID) array disposed on the first superconducting region and a second SQUID array disposed on the second superconducting region.

11. The system of claim 10, wherein the first SQUID array and the second SQUID array are coupled to the boundary region.

12. The system of claim 1, wherein the boundary region has a width of about 50 nm.

13. The system of claim 1, wherein the photon radiation has a frequency of about 2.55 THz.

14. The system of claim 1, wherein the photon radiation has a frequency of about 4.69 THz.

15. A system comprising:
 a substrate;
 a film disposed on the substrate, the film comprising a high-temperature superconductor compound belonging to the class of compounds having a compositional form of $R_{1-y}M_yBa_2Cu_3{-z}T_zO_x$, where x is oxygen content and $6 \leq x \leq 7$, wherein $0 \leq y \leq 1$, where $0 \leq z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn);
 a first superconducting region formed within the film, the first superconducting region having a first stabilized oxygen content of about 6.81;
 a second superconducting region formed within the film and located adjacent to the first superconducting region, the second superconducting region having a second stabilized oxygen content of about 7;
 a boundary region formed within the film and separating the first superconducting region from the second superconducting region, the boundary region having a width of about 50 nm; and
 a voltage source connected to the first superconducting region and the second superconducting region, wherein the boundary region emits electromagnetic radiation responsive to an applied voltage from the voltage source to one of the first superconducting region and the second superconducting region, wherein the applied voltage from the voltage source is less than about 10 meV, wherein a current flows from the second superconducting region to the first superconducting region responsive to the applied voltage.

16. The system of claim 15 further comprising a first superconducting quantum interference device (SQUID) array disposed on the first superconducting region and a second SQUID array disposed on the second superconducting region.

17. The system of claim 16, wherein the first SQUID array and the second SQUID array are coupled to the boundary region.

18. A system comprising:
 a substrate;
 a film disposed on the substrate, the film comprising a high-temperature superconductor compound belonging to the class of compounds having a compositional form of $R_{1-y}M_yBa_2Cu_3{-z}T_zO_x$, where x is oxygen content and $6 \leq x \leq 7$, wherein $0 \leq y \leq 1$, where $0 \leq z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn);
 a first superconducting region formed within the film, the first superconducting region having a first stabilized oxygen content of about 6.81
 a second superconducting region formed within the film and located adjacent to the first superconducting region, the second superconducting region having a second stabilized oxygen content of about 7;
 a boundary region formed within the film and separating the first superconducting region from the second superconducting region, the boundary region having a width of about 50 nm; and
 a voltage source connected to the first superconducting region and the second superconducting region, wherein the boundary region emits electromagnetic radiation responsive to an applied voltage from the voltage source to one of the first superconducting region and the second superconducting region, wherein the applied voltage from the voltage source is greater than or equal to about 10 meV, wherein a current flows from the first superconducting region to the second superconducting region responsive to the applied voltage.

19. The system of claim 18 further comprising a first superconducting quantum interference device (SQUID) array disposed on the first superconducting region and a second SQUID array disposed on the second superconducting region.

20. The system of claim 19, wherein the first SQUID array and the second SQUID array are coupled to the boundary region.

* * * * *